(12) United States Patent
Chin

(10) Patent No.: US 10,199,141 B2
(45) Date of Patent: Feb. 5, 2019

(54) FLEX FLAT CABLE STRUCTURE AND ASSEMBLY OF CABLE CONNECTOR AND FLEX FLAT CABLE

(71) Applicant: ENERGY FULL ELECTRONICS CO., LTD., New Taipei (TW)

(72) Inventor: Hsu-Shen Chin, New Taipei (TW)

(73) Assignee: ENERGY FULL ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 15/790,688

(22) Filed: Oct. 23, 2017

(65) Prior Publication Data

US 2018/0190408 A1 Jul. 5, 2018

Related U.S. Application Data

(60) Provisional application No. 62/441,033, filed on Dec. 30, 2016.

(51) Int. Cl.
| | |
|---|---|
| *H01B 7/08* | (2006.01) |
| *H01B 13/00* | (2006.01) |
| *H01B 13/06* | (2006.01) |
| *H01R 12/59* | (2011.01) |
| *H01R 13/6599* | (2011.01) |
| *H01R 12/62* | (2011.01) |
| *H05K 1/02* | (2006.01) |

(Continued)

(52) U.S. Cl.
CPC ......... *H01B 7/0861* (2013.01); *H01B 7/0838* (2013.01); *H01B 13/0013* (2013.01); *H01B 13/06* (2013.01); *H01R 12/594* (2013.01); *H01R 12/596* (2013.01); *H01R 13/6599* (2013.01); *H01R 12/62* (2013.01); *H01R 13/6658* (2013.01); *H01R 24/60* (2013.01); *H05K 1/0219* (2013.01); *H05K 2201/0715* (2013.01); *H05K 2201/10356* (2013.01)

(58) Field of Classification Search
CPC ................................ H01B 7/08; H01R 13/648
USPC ....................................... 174/117 F; 439/608
See application file for complete search history.

(56) References Cited

U.S. PATENT DOCUMENTS

| | | | | |
|---|---|---|---|---|
| 4,645,868 A | * | 2/1987 | Suzuki ................. | H01B 7/0823 174/115 |
| 6,740,808 B1 | * | 5/2004 | Chang .................. | H01B 7/0861 174/113 R |

(Continued)

*Primary Examiner* — Chau N Nguyen
(74) *Attorney, Agent, or Firm* — Muncy, Geissler, Olds & Lowe, P.C.

(57) ABSTRACT

A flex flat cable (FFC) is proposed. The FFC comprises a plurality of first signal transmitting lines arranged in parallel with one another. Each of the plurality of first signal transmitting lines comprises a first transmitting conductor configured to transmit a signal, a first insulating layer enclosing the first transmitting conductor, and a second insulating layer enclosing the first insulating layer. The FFC further includes a first insulating coat enclosing the plurality of first signal transmitting lines, a first ground conductor arranged at one side of the first insulating coat and configured to be grounded, a metallic shielding layer enclosing the first insulating coat and the first ground conductor and a second insulating coat enclosing the metallic shielding layer, and a second insulating coat enclosing the metallic shielding layer.

The first ground conductor contacts the metallic shielding layer.

14 Claims, 5 Drawing Sheets

(51) Int. Cl.
*H01R 13/66* (2006.01)
*H01R 24/60* (2011.01)

(56) References Cited

U.S. PATENT DOCUMENTS

| | | | | |
|---|---|---|---|---|
| 7,462,071 B1* | 12/2008 | Wu | ........................ | H01R 9/032 |
| | | | | 439/497 |
| 7,956,290 B2* | 6/2011 | Wang | ..................... | H01B 11/00 |
| | | | | 174/117 F |
| 9,350,125 B2* | 5/2016 | Jones | ...................... | H01R 24/60 |
| 9,620,910 B2* | 4/2017 | Chen | .................... | H01R 13/665 |
| 9,728,303 B2* | 8/2017 | Kobayashi | ............ | H01B 11/002 |
| 2008/0041610 A1* | 2/2008 | Cheng | .................. | H01B 7/0861 |
| | | | | 174/117 F |

* cited by examiner

FLEX FLAT CABLE STRUCTURE AND ASSEMBLY OF CABLE CONNECTOR AND FLEX FLAT CABLE

1. FIELD OF THE DISCLOSURE

The present disclosure relates to a flex flat cable (FFC), and more particularly, to an FFC designed to reduce electromagnetic interference (EMI).

2. DESCRIPTION OF THE RELATED ART

A flex flat cable (FFC) is a new kind of data cable. The FFC is produced after an insulating material and an extremely thin tin-coated flat copper line are compressed using an automatic device. The merits of the FFC is neat arrangement, a large amount of transmission volume, flat structure, compactness, easy to dismantle, flexibility so the FFC, as a data transmission cable, can be easily and flexibly applied to a variety of electronic products. Especially, the FFC can be used in high-frequency and bending conditions such as the connection of mobile components. As for the way of connection, insertion with a connector and direct welding on a printed circuit board (PCB) are both possible.

The FFC of the related art includes a plurality of signal lines and a plurality of ground conductors. The plurality of signal lines and the plurality of ground conductors are configured to conduct electrical signals. To avoid electromagnetic interference (EMI), a metallic shielding layer is enclosed by a plurality of signal lines, which forms a metallic shield, and a ground conductor is arranged outside the metallic shielding layer, which enhances the capability of anti-EMI. However, the ground conductor arranged outside the metallic shielding layer fails to be electrically connected to the metallic shielding layer stably, and the metallic shielding layer fails to enclose the ground conductor. As a result, cracks easily occur between the ground conductor and the metallic shielding layer when the cable is processed, which generates EMI due to the leakage of the electromagnetic waves.

Besides, material for enclosing wires is seldom put in the metallic shielding layer so that the signal line and a ground line in the metallic shielding layer fail to be fixed firmly on their positions. As a result, it is hard to align the PCB successfully while the PCB is welded, which is disadvantageous of automatic production. The shaking of the wires easily causes loose welding or poor connection, thereby affecting the quality of signal transmission.

In addition, the shell and the metallic shielding layer are configured to form a shield to protect the FFC of related art against EMI. However, there is no shield between the shell and the flex flat cable so the electromagnetic waves easily leaks from the shell and the flex flat cable, thereby affecting the quality of signal transmission.

Therefore, it is important for the present disclosure to design a new FFC to solve the technical problem that cracks easily occur between the ground conductor and the metallic shielding layer when the cable is processed. It is also important for the present disclosure to ensure that the wires in the metallic shielding layer are firmly fixed on their positions and that a high-quality consecutive metallic shielding layer is formed to avoid EMI.

SUMMARY

In light of this, it is necessary to propose a flex flat cable (FFC) to solve the problem of cracks appearing between a ground conductor and a metallic shielding layer in the FFC of related art and the problem of poor flexibility and shielding effects of the FFC of related art.

The present disclosure proposes a flex flat cable (FFC). The FFC comprises a plurality of first signal transmitting lines arranged in parallel with one another. Each of the plurality of first signal transmitting lines comprises a first transmitting conductor configured to transmit a signal, a first insulating layer enclosing the first transmitting conductor, and a second insulating layer, enclosing the first insulating layer. The FFC further includes a first insulating coat enclosing the plurality of first signal transmitting lines, a first ground conductor arranged at one side of the first insulating coat and configured to be grounded, a metallic shielding layer enclosing the first insulating coat and the first ground conductor and a second insulating coat enclosing the metallic shielding layer, and a second insulating coat enclosing the metallic shielding layer. The first ground conductor contacts the metallic shielding layer.

According to the present disclosure, the FFC further comprises a plurality of second signal transmitting lines. The plurality of second signal transmitting lines and the plurality of first signal transmitting lines are arranged in parallel with one another. Each of the plurality of second signal transmitting lines comprises a second transmitting conductor configured to transmit a signal, and a third insulating layer enclosing the second transmitting conductor.

According to the present disclosure, the FFC further comprises a plurality of ground lines. Each of the plurality of ground lines comprises a second ground conductor configured to be grounded, and a fourth insulating layer enclosing the second ground conductor.

According to the present disclosure, first insulating coat, the second insulating coat, the first insulating layer, the second insulating layer, the third insulating layer, and the fourth insulating layer is selected from a group consisting of as polyethylene (PE), polyvinyl chloride (PVC), Thermoplastic Elastomer (TPE), Thermoplastic Polyurethane (TPU), thermoplastic rubber (TPR), Thermoplastic Polyolefin (TPO), Polyurethane (PUR), Polypropylene (PP), Polyolefins (PO), PolyVinyliDene Fluoride (PVDF), Ethylene-chlorotrifluororthylene copolymer (ECTFE), ethylene-tetra-fluoro-ethylene (ETFE), Teflon Fluorinated ethylene propylene (Teflon FEP), Polytetrafluoroethene (PTFE), Teflon, and nylon.

According to the present disclosure, a permittivity of the second insulating coat is greater than a permittivity of the first insulating coat.

According to the present disclosure, the area of a cross section of the second ground conductor is greater than the area of a cross section of the first transmitting conductor.

According to the present disclosure, the permittivity of the first insulating layer, the permittivity of the second insulating layer, and the permittivity of the third insulating layer are different from one another.

According to the present disclosure, the permittivity of the first insulating layer, the permittivity of the second insulating layer, and the permittivity of the fourth insulating layer are different from one another.

The present disclosure also proposes an assembly of a cable connector and a flex flat cable. The assembly includes an electrical connector and a flex flat cable. The electrical connector includes a housing, a printed circuit board (PCB), a plurality of terminals, and a shell. The PCB includes a plurality of conductive portions and a plurality of connective portions. The plurality of conductive portions are electrically connected to the plurality of connective portions correspondingly. One terminal of the plurality of terminals is connected to one of the plurality of connective portions. The shell is assembled to the housing. The flex flat cable comprises a plurality of first signal transmitting lines arranged in parallel with one another. Each of the plurality of first signal transmitting lines comprises a first transmitting conductor configured to transmit a signal, a first insulating layer enclosing the first transmitting conductor, and a second insulating layer, enclosing the first insulating layer. The FFC further includes a first insulating coat enclosing the plurality of first signal transmitting lines, a first ground conductor arranged at one side of the first insulating coat and configured to be grounded, a metallic shielding layer enclosing the first insulating coat and the first ground conductor, and a second insulating coat enclosing the metallic shielding layer. The first ground conductor contacts the metallic shielding layer. The first transmitting conductor, or the first ground conductor, or the second transmitting conductor, or the second ground conductor is connected to the plurality of conductive portions.

Compared with the related art, an FFC and an assembly of a cable connector and an FFC provided by the present disclosure are characterized by the FFC with an adjustable impedance with adjustment of the size of a first transmitting conductor, the size of a second transmitting conductor, and the size of a second ground conductor and adjustment of the permittivity of an insulating material enclosing the first transmitting conductor, the permittivity of the second transmitting conductor, and the permittivity of the second ground conductor. Besides, the first transmitting conductor, the second transmitting conductor, and a ground line are enclosed by a metallic shielding layer to avoid EMI, and the ground conductor and the metallic shielding layer are well electrically connected through an accommodating container, which improves the shielding effect of metal. The metallic shielding layer, the first transmitting conductor, the second transmitting conductor, and the ground line are all stuffed with the insulating material so that the first transmitting conductor, the second transmitting conductor, and the ground line are all fixed to their positions, which facilitates the alignment of an automatically welded and produced printed circuit board (PCB). Besides, the double-sided conductive material is arranged between a shell and the FFC so that the double-sided conductive material, the shell, and the FFC define a consecutive shielding layer. In this way, the problem of leakage of the electromagnetic waves between the shell and the cable in the cable structure of the related art is successfully solved.

These and other objectives of the claimed invention will no doubt become obvious to those of ordinary skill in the art after reading the following detailed description of the preferred embodiment that is illustrated in the various figures and drawings.

DETAILED DESCRIPTION OF THE EMBODIMENTS

To comprehend the features, methods, intended functions, and objects of the present disclosure, the practical embodiments will be listed, and the figures and the illustration numbers are as follows.

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

Figure 1:
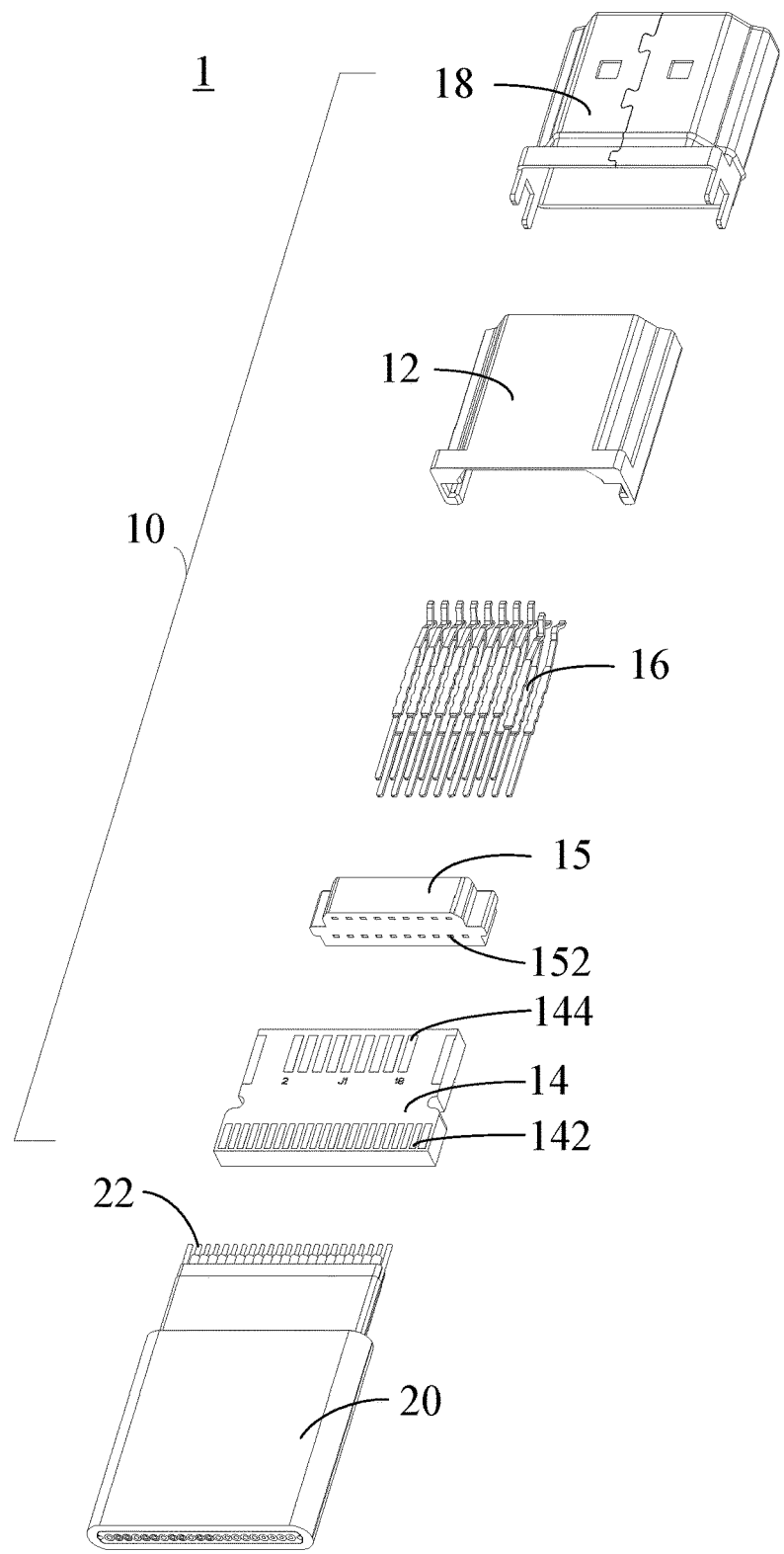
FIG. 1 illustrates an exploded diagram of an assembly of a cable connector and a flex flat cable (FFC) according to a first embodiment of the present disclosure.

Please refer to FIG. 1 illustrating an exploded diagram of an assembly of a cable connector and a flex flat cable (FFC) 1 according to a first embodiment of the present disclosure. The assembly of the cable connector and the FFC 1 includes an electrical connector 10 and an FFC 20. The FFC 20 is inserted into the electrical connector 10. The electrical connector 10 may be any connectors as long as the data rate of a connector, such as HDMI/USB3.0/USB3.1/Display Port/SATA, is higher than 1 Gb/s.

The electricity connector 10 includes a housing 12, a printed circuit board (PCB) 14, a spacer 15, a plurality of terminals 16, and a shell 18. The spacer 15 is assembled to the housing 12. The spacer 15 includes a plurality of accommodating chambers 152. The PCB 14 includes a plurality of conductive portions 142 and a plurality of connective portions 144. The plurality of conductive portions 142 are electrically connected to the plurality of connective portions 144 correspondingly. One terminal of each of the plurality of terminals 16 penetrates the plurality of accommodating chambers 152 correspondingly and is connected to the plurality of connective portions 144. The shell 18 is assembled to the housing 12.

Figure 2:
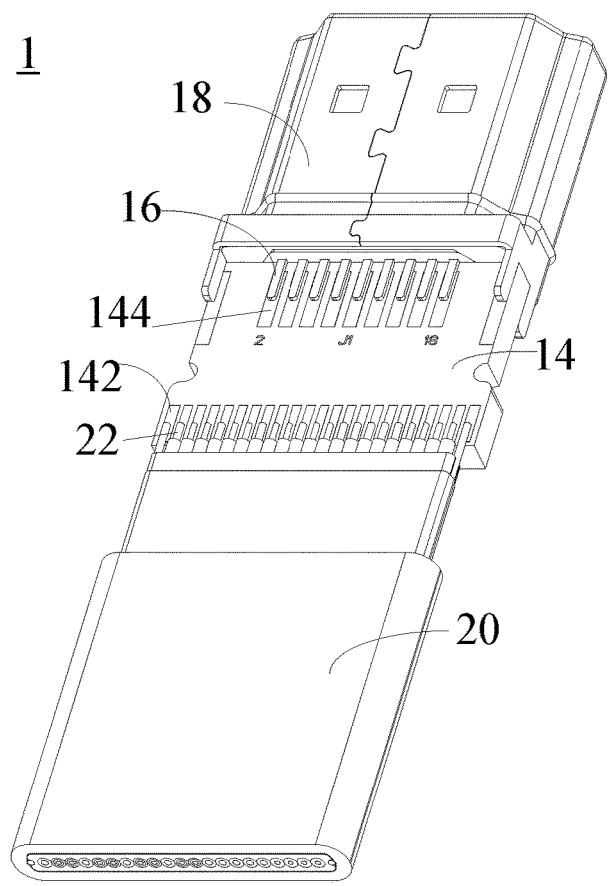
FIG. 2 illustrates the assembly of the cable connector and the flex flat cable (FFC) according to the first embodiment of the present disclosure.

Please refer to FIG. 2 illustrating an assembly of the housing 12, the PCB 14, the spacer 15, the plurality of terminals 16, and the shell 18 according to the first embodiment of the present disclosure. The FFC 20 is electrically connected to the plurality of conductive portions 142 on the PCB 14. The plurality of terminals 16 are electrically connected to the plurality of connective portions 144 on the PCB 14. Therefore, the FFC 20 can transmit or receive data to the device which the plurality of terminals 16 are connected to.

Figure 3:
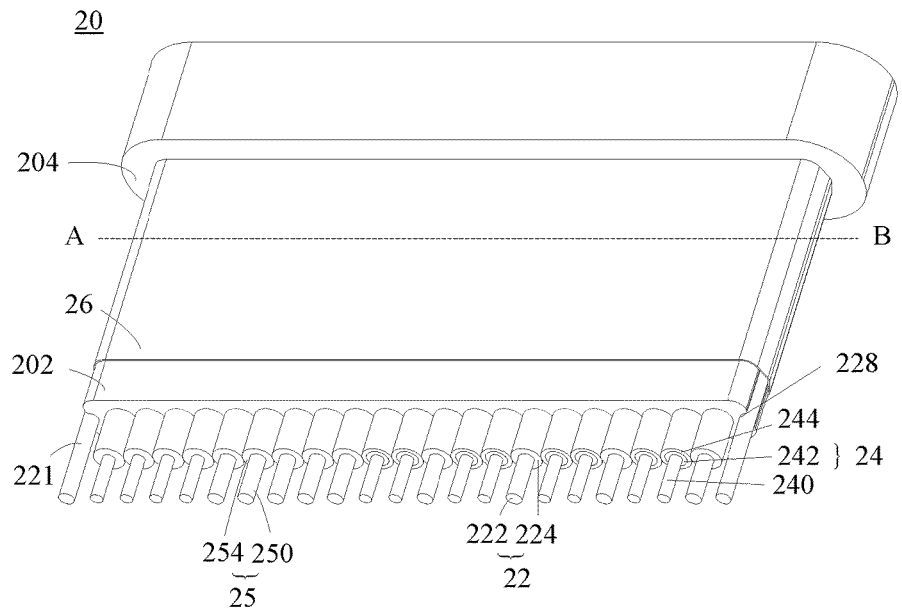
FIG. 3 illustrates the flex flat cable (FFC) according to the first embodiment of the present disclosure.
Figure 4:
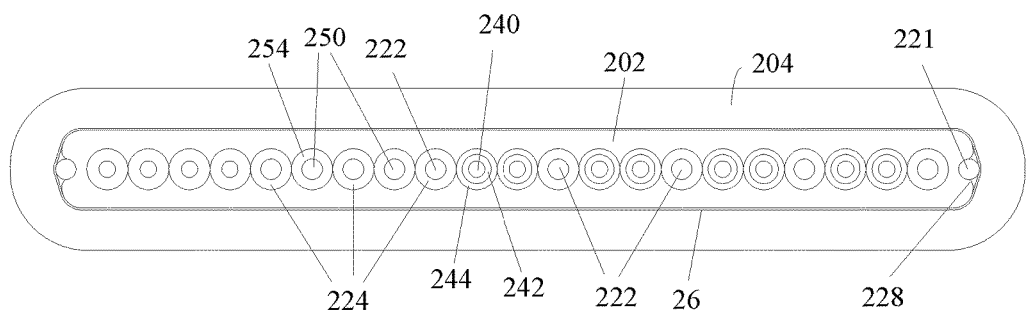
FIG. 4 illustrates a cross-sectional view of the FFC as shown in FIG. 3 along a line AB.

Please refer to FIG. 3 and FIG. 4. FIG. 3 illustrates the FFC 20 proposed by the present disclosure. FIG. 4 illustrates a cross-sectional view of the FFC 20. The FFC 20 includes a ground line 22, a first signal transmitting line 24, a second signal transmitting line 25, a metallic shielding layer 26, a first insulating coat 202, a second insulating coat 204, and a first ground conductor 221. The cross-section of the ground line 22, the cross-section of the first signal transmitting line 24, and the cross-section of the second signal transmitting line 25 are all round, and the ground line 22, the first signal transmitting line 24, and the second signal transmitting line 25 are arranged in parallel with one another. The first insulating coat 202 encloses the ground line 22, the first signal transmitting line 24, and the second signal transmitting line 25 so that no cracks can stay among the ground line 22, the first signal transmitting line 24, and the second signal transmitting line 25 of the FFC 20. It not only facilitates reduce the frictions caused by shaking but also helps the automatic device weld the conductor of the FFC 20 on the conductive portion 142 on the PCB 14. The second insulating coat 204 encloses the first insulating coat 202. The metallic shielding layer 26 is arranged between the first insulating coat 202 and the second insulating coat 204. The metallic shielding layer 26 may be a metallic web or a metallic thin film. The first ground conductor 221 is arranged between the first insulating coat 202 and the metallic shielding layer 26 and is electrically connected to the metallic shielding layer 26. The metallic shielding layer 26 is grounded so a metallic shield is formed to the ground line 22, the first signal transmitting line 24, and the second signal transmitting line 25.

The first signal transmitting line 24 includes a first transmitting conductor 240, a first insulating layer 242, and a second insulating layer 244. The first insulating layer 242 enclosures the first signal transmitting line 24. The second insulating layer 244 enclosures the first insulating layer 242. In this way, the first signal transmitting line 24 is enclosed by both of the first insulating layer 242 and the second insulating layer 244.

The present disclosure further includes a second signal transmitting line 25 and a ground line 22. The second signal transmitting line 25 includes a second transmitting conductor 250 and a third insulating layer 254. The third insulating layer 254 encloses the second transmitting conductor 250. The ground line 22 includes a second ground conductor 222 and a fourth insulating layer 224. The fourth insulating layer 224 encloses the second ground conductor 222. In this embodiment, the area of the cross section of the first transmitting conductor 240 is different from the area of the cross section of the second ground conductor 222. In another embodiment, the area of the cross section of a second ground conductor 222 is greater than the area of the cross section of a first transmitting conductor 240.

In the present disclosure, the first ground conductor 221 is parallel to the ground line 22, the first signal transmitting line 24, and the second signal transmitting line 25. The first ground conductor 221, the ground line 22, the first signal transmitting line 24, and the second signal transmitting line 25 are all enclosed by the metallic shielding layer 26. To improve the stability of the first ground conductor 221 electrically connected to the metallic shielding layer 26 and to avoid the cracks from occurring between the first ground conductor 221 and the metallic shielding layer 26 when the cable is processed, it is necessary to enclose the first ground conductor 221 with the metallic shielding layer 26 in this embodiment. While the metallic shielding layer 26 is enclosed, the first ground conductor 221 needs to be fixed so an accommodating container 228 is arranged between the first insulating coat 202 and the metallic shielding layer 26 to partially enclose the first ground conductor 221. The accommodating container 228 can fix the first ground conductor 221 to prevent unnecessary cracks from occurring while the cable is processed so that the first ground conductor 221 can be electrically connected to the metallic shielding layer 26, thereby preventing EMI due to leakage of the electromagnetic waves from occurring in the finished FFC 20. The first transmitting conductor 240, the second transmitting conductor 250, and the second ground conductor 222 of the FFC 20 all protrude the first insulating coat 202, the second insulating coat 204, the first insulating layer 242, the second insulating layer 244, the third insulating layer 254, and the fourth insulating layer 224. When the FFC 20 is inserted into the electrical connector 10, the protruded first transmitting conductor 240, the protruded second transmitting conductor 250, and the protruded second ground conductor 222 may contact the conductive portions 142 of the PCB 14 correspondingly.

The first insulating layer 242 and the second insulating layer 244 are formed by two kinds of materials with different permittivities correspondingly. Moreover, the fourth insulating layer 224 enclosing the second ground conductor 222 and the third insulating layer 254 enclosing the second transmitting conductor 250 are formed by two kinds of materials with different permittivities correspondingly. In another embodiment, the permittivity of the second insulating layer 244 is greater than the permittivity of the first insulating layer 242.

However, what is described is exemplary rather than limit the present disclosure. The impedance of the FFC 20 proposed by the present disclosure can be altered by adjusting the arrangement or diameter of the ground line 22, the first signal transmitting line 24, and the second signal transmitting line 25 or by modifying the permittivity or structure of the first insulating layer 242, the second insulating layer 244, the third insulating layer 254, and the fourth insulating layer 224.

The first insulating coat 202, second insulating coat 204, first insulating layer 242, second insulating layer 244, third insulating layer 254, and fourth insulating layer 224 may be insulating materials with highly thermal resistance such as polyethylene (PE), polyvinyl chloride (PVC), Thermoplastic Elastomer (TPE), Thermoplastic Polyurethane (TPU), thermoplastic rubber (TPR), Thermoplastic Polyolefin (TPO), Polyurethane (PUR), Polypropylene (PP), Polyolefins (PO), PolyVinyliDene Fluoride (PVDF), Ethylene-chlorotrifluorothylene copolymer (ECTFE), ethylene-tetra-fluoro-ethylene (ETFE), Teflon Fluorinated ethylene propylene (Teflon FEP), Polytetrafluoroethene (PTFE), Teflon, and nylon. The signal conductor 221, first ground conductor 261, and second ground line 262 may be a highly thin, flat tinned copper wire. The first transmitting conductor 240, the second transmitting conductor 250, the first ground conductor 221, and the second ground conductor 222 may be all extremely thin tin-coated flat copper lines.

In the present embodiment, the arrangement of the ground line 22 and the two signal transmitting lines (i.e., the first signal transmitting line 24 and the second signal transmitting line 25) is of two types. As FIG. 4 illustrates, one type is that the ground line and the two signal transmitting lines are alternatively arranged, that is, the order of the ground line 22, the second signal transmitting line 25, the ground line 22, the second signal transmitting line 25, and the ground line 22. The other type is that the two signal transmitting lines are sandwiched by two of the ground lines 22, that is, the order of the ground line 22, the first signal transmitting line 24, the first signal transmitting line 24, and the ground line 22. In this way, the ground line can be properly arranged to ensure the quality of signal transmission based on the speed of the signal transmitted through the transmitting line and the sort of the transmitting line.

Figure 5:
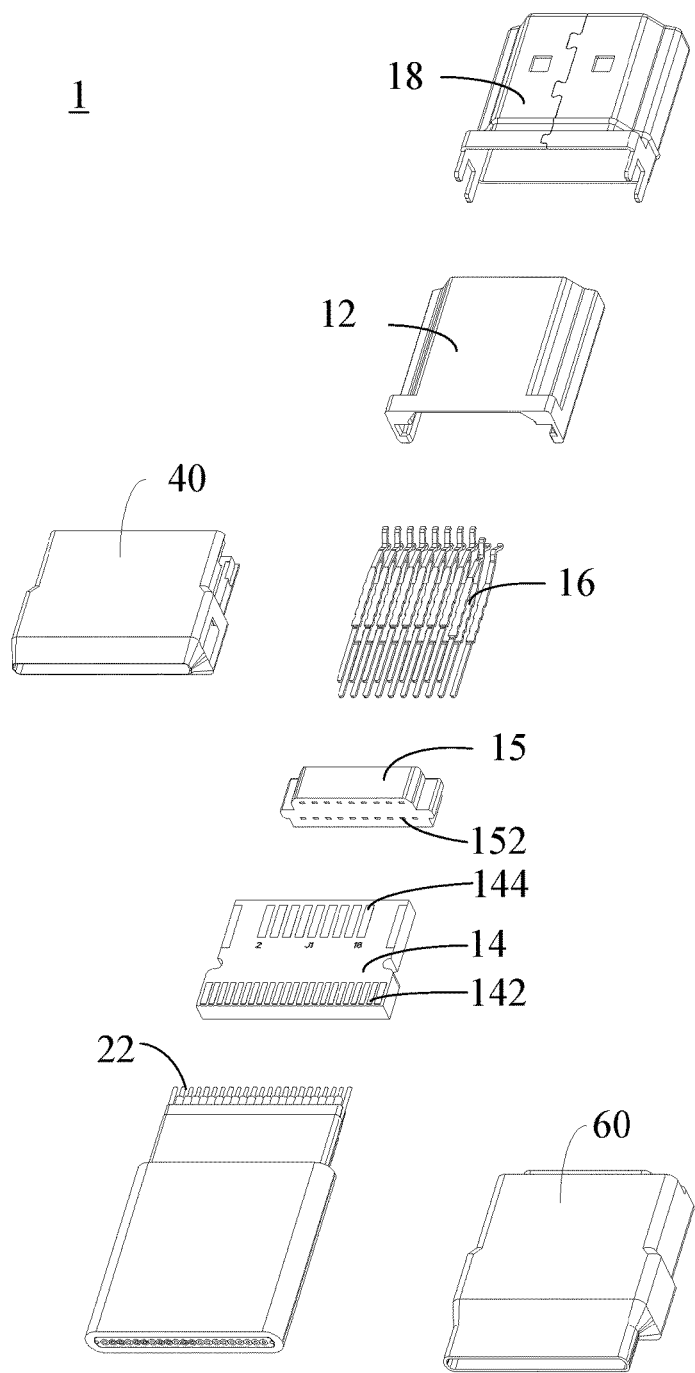
FIG. 5 illustrates an exploded diagram of an assembly of a cable connector and a flex flat cable (FFC) according to a second embodiment of the present disclosure.

Please refer to FIG. 5 illustrating an exploded diagram of an assembly of a cable connector and a flex flat cable (FFC) 1 according to a second embodiment of the present disclosure. Based on the first embodiment, the assembly of the cable connector and the FFC 1 further includes an inner mold 40 and a shielding layer 60. The inner mold 40 is arranged between a shell 18 and an FFC 20. The inner mold 40 encloses and is fixed to a printed circuit board (PCB) 14. The inner mold 40 is fabricated by an insulating material or material with the property of poor conductivity. The shielding layer 60 is fabricated by the double-sided conductive material. The shielding layer 60 encloses and attaches to the inner mold 40. The shielding layer 60 is connected to the shell 18, and the other terminal of the shielding layer 60 is connected to a metallic shielding layer 26 of the FFC 20. The inner mold 40 is arranged between the shielding layer 60 and the PCB 14 to avoid a shortcut. Therefore, the shell 18, the metallic shielding layer 26, and the shielding layer 60 are electrically connected with one another to produce a consecutive shielding effect. Further, the FFC 20 is improved and the signal quality is not affected by EMI.

Figure 6:
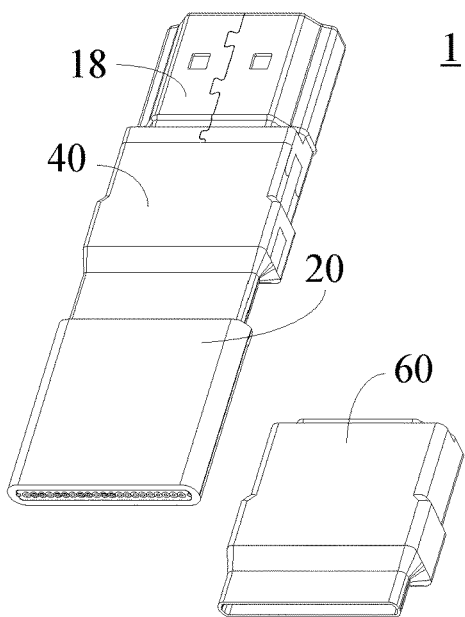
FIGS. 6 and 7 illustrate the assembly of the cable connector and the flex flat cable (FFC) according to the second embodiment of the present disclosure.
Figure 7:
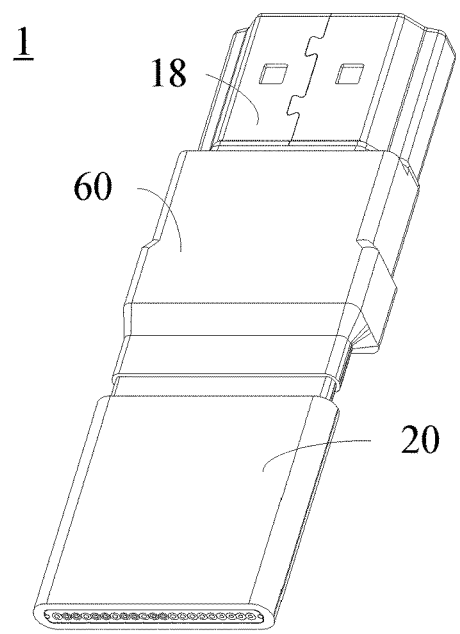

Please refer to FIG. 6 and FIG. 7. FIG. 6 illustrates a stereogram of an assembly of the shell 18, the inner mold 40, and the FFC 20 according to the second embodiment of the present disclosure. FIG. 7 illustrates a stereogram of the assembly of the cable connector and the FFC 1 illustrated in FIG. 6 with the shielding layer 60 according to the second embodiment of the present disclosure. In the second embodiment of the present disclosure, the shielding layer 60 defines a consecutive shield between the shell 18 and the FFC 20, and the consecutive shield can improve the occurrence of leakage of the electromagnetic waves between the shell 18 and the FFC 20 because lack of a metallic shield in the related art.

Although the present disclosure has been disclosed as preferred embodiments, the foregoing preferred embodiments are not intended to limit the present disclosure. Those of ordinary skill in the art, without departing from the spirit and scope of the present disclosure, can make various kinds of modifications and variations to the present disclosure. Therefore, the scope of the claims of the present disclosure must be defined.

What is claimed is:

1. A flex flat cable (FFC), comprising:
 a plurality of first signal transmitting lines, arranged in parallel with one another, each of the plurality of first signal transmitting lines comprising:
  a first transmitting conductor, configured to transmit a signal;
  a first insulating layer, enclosing the first transmitting conductor; and
  a second insulating layer, enclosing the first insulating layer;
 a first insulating coat, enclosing the plurality of first signal transmitting lines;
 a first ground conductor, arranged at one side of the first insulating coat and configured to be grounded;
 a metallic shielding layer, enclosing the first insulating coat and the first ground conductor wherein the first ground conductor contacts the metallic shielding layer; and
 a second insulating coat, enclosing the metallic shielding layer,
 wherein the FFC further comprises a plurality of second signal transmitting lines; the plurality of second signal transmitting lines and the plurality of first signal transmitting lines are arranged in parallel with one another; each of the plurality of second signal transmitting lines comprises:
  a second transmitting conductor, configured to transmit a signal; and
  a third insulating layer, enclosing the second transmitting conductor,
 wherein the FFC further comprises a plurality of ground lines; each of the plurality of ground lines comprises:
  a second ground conductor, configured to be grounded; and
  a fourth insulating layer, enclosing the second ground conductor,
 wherein an area of a cross section of the second ground conductor is greater than an area of a cross section of the first transmitting conductor.

2. The FFC of claim 1, wherein the first insulating coat, the second insulating coat, the first insulating layer, the second insulating layer, the third insulating layer, and the fourth insulating layer is selected from a group consisting of as polyethylene (PE), polyvinyl chloride (PVC), Thermoplastic Elastomer (TPE), Thermoplastic Polyurethane (TPU), thermoplastic rubber (TPR), Thermoplastic Polyolefin (TPO), Polyurethane (PUR), Polypropylene (PP), Polyolefins (PO), PolyVinyliDene Fluoride (PVDF), Ethylene-chlorotrifluororthylene copolymer (ECTFE), ethylene-tetra-fluoro-ethylene (ETFE), Teflon Fluorinated ethylene propylene (Teflon FEP), Polytetrafluoroethene (PTFE), Teflon, and nylon.

3. The FFC of claim 1, wherein a permittivity of the second insulating coat is greater than a permittivity of the first insulating coat.

4. The FFC of claim 1, wherein the permittivity of the first insulating layer, the permittivity of the second insulating layer, and the permittivity of the third insulating layer are different from one another.

5. The FFC of claim 1, wherein the permittivity of the first insulating layer, the permittivity of the second insulating layer, and the permittivity of the fourth insulating layer are different from one another.

6. An assembly of a cable connector and a flex flat cable, comprising:
 an electrical connector, comprising:
  a housing;
  a printed circuit board (PCB), comprising a plurality of conductive portions and a plurality of connective portions; the plurality of conductive portions being electrically connected to the plurality of connective portions correspondingly;
  a plurality of terminals, one terminal of the plurality of terminals connected to one of the plurality of connective portions; and
  a shell, assembled to the housing; and
 a flex flat cable structure, comprising:
  a plurality of first signal transmitting lines, arranged in parallel with one another, each of the plurality of first signal transmitting lines comprising:
   a first transmitting conductor, configured to transmit a signal;
   a first insulating layer, enclosing the first transmitting conductor; and
   a second insulating layer, enclosing the first insulating layer;
  a first insulating coat, enclosing the plurality of first signal transmitting lines;
  a first ground conductor, arranged at one side of the first insulating coat and configured to be grounded;
  a metallic shielding layer, enclosing the first insulating coat and the first ground conductor wherein the first ground conductor contacts the metallic shielding layer; and a second insulating coat, enclosing the metallic shielding layer;

an inner mold, arranged between the shell and the FFC, and enclosing and being fixed to the PCB; and a shielding layer, enclosing and being attached to the inner mold; the shielding layer being electrically connected to the shell and the FFC to make the shielding layer, the shell, and the FFC define a consecutive metallic shield, wherein the first transmitting conductor or the first ground conductor is connected to the plurality of conductive portions.

7. The assembly of the cable connector and the flex flat cable of claim 6, wherein the electrical connector comprises a spacer; the spacer is assembled to the housing; the spacer comprises an accommodating chamber; one terminal of the plurality of terminals penetrates each of the corresponding accommodating chamber and is connected to the plurality of connective portions.

8. The assembly of the cable connector and the flex flat cable of claim 6, wherein the FFC further comprises a plurality of second signal transmitting lines; the plurality of second signal transmitting lines and the plurality of first signal transmitting lines are arranged in parallel with one another; each of the plurality of second signal transmitting lines comprises:

a second transmitting conductor, configured to transmit a signal; and a third insulating layer, enclosing the second transmitting conductor.

9. The assembly of the cable connector and the flex flat cable of claim 8, wherein the FFC further comprises a plurality of ground lines; each of the plurality of ground lines comprises:

a second ground conductor, configured to be grounded; and a fourth insulating layer, enclosing the second ground conductor.

10. The assembly of the cable connector and the flex flat cable of claim 9, wherein the first insulating coat, the second insulating coat, the first insulating layer, the second insulating layer, the third insulating layer, and the fourth insulating layer is selected from a group consisting of as polyethylene (PE), polyvinyl chloride (PVC), Thermoplastic Elastomer (TPE), Thermoplastic Polyurethane (TPU), thermoplastic rubber (TPR), Thermoplastic Polyolefin (TPO), Polyurethane (PUR), Polypropylene (PP), Polyolefins (PO), Poly-VinyliDene Fluoride (PVDF), Ethylene-chlorotrifluororthylene copolymer (ECTFE), ethylene-tetra-fluoro-ethylene (ETFE), Teflon Fluorinated ethylene propylene (Teflon FEP), Polytetrafluoroethene (PTFE), Teflon, and nylon.

11. The assembly of the cable connector and the flex flat cable of claim 9, wherein the area of a cross section of the second ground conductor is greater than the area of a cross section of the first transmitting conductor.

12. The assembly of the cable connector and the flex flat cable of claim 9, wherein the permittivity of the first insulating layer, the permittivity of the second insulating layer, and the permittivity of the fourth insulating layer are different from one another.

13. The assembly of the cable connector and the flex flat cable of claim 8, wherein the permittivity of the first insulating layer, the permittivity of the second insulating layer, and the permittivity of the third insulating layer are different from one another.

14. The assembly of the cable connector and the flex flat cable of claim 6, wherein a permittivity of the second insulating coat is greater than a permittivity of the first insulating coat.

* * * * *